United States Patent [19]

Chatter

[11] Patent Number: 5,590,078
[45] Date of Patent: Dec. 31, 1996

[54] METHOD OF AND APPARATUS FOR IMPROVED DYNAMIC RANDOM ACCESS MEMORY (DRAM) PROVIDING INCREASED DATA BANDWIDTH AND ADDRESSING RANGE FOR CURRENT DRAM DEVICES AND/OR EQUIVALENT BANDWIDTH AND ADDRESSING RANGE FOR SMALLER DRAM DEVICES

[76] Inventor: Mukesh Chatter, 53 Godfrey La., Milford, Mass. 01757

[21] Appl. No.: 320,058

[22] Filed: Oct. 7, 1994

[51] Int. Cl.⁶ ............................................. G11C 7/00
[52] U.S. Cl. .............................. 365/189.01; 365/230.02; 365/233
[58] Field of Search ................... 365/189.01, 189.02, 365/230.01, 230.02, 233

[56] References Cited

U.S. PATENT DOCUMENTS

| | | | |
|---|---|---|---|
| 5,434,817 | 7/1995 | Ware et al. | 365/189.01 |
| 5,440,749 | 8/1995 | Moore et al. | 395/800 |

Primary Examiner—David C. Nelms
Assistant Examiner—Vu A. Le
Attorney, Agent, or Firm—Rines and Rines

[57] ABSTRACT

A method of and apparatus for improving the accessing capability of asynchronous and synchronous dynamic random access memory devices by a novel interfacing and accessing procedure in which the same pins are used for each of row, column and data accessing and in both the write and read cycles; such enabling effective increasing of the data bandwidth and addressing range in substantially the same size packages and pin counts of current DRAMs, or providing equivalent performance in smaller packages with fewer pins. This enables reducing the number of required components for the same configuration, providing compatable density in smaller packages, and with lower power consumption and finer granularity and pin compatability for a wide range of current DRAMs.

17 Claims, 8 Drawing Sheets

ASYNC PARAS

ASYNC PARAS

SYNC PARAS

FIG. 10

METHOD OF AND APPARATUS FOR IMPROVED DYNAMIC RANDOM ACCESS MEMORY (DRAM) PROVIDING INCREASED DATA BANDWIDTH AND ADDRESSING RANGE FOR CURRENT DRAM DEVICES AND/OR EQUIVALENT BANDWIDTH AND ADDRESSING RANGE FOR SMALLER DRAM DEVICES

The present invention relates to dynamic random access memory (DRAM) devices operating in either asynchronous or synchronous modes, being more particularly concerned with the increasing of the data bandwidth and addressing range of current DRAM devices, and/or providing equivalent bandwidth and addressing range thereof for smaller devices—the invention attaining such results with a radically new and different interface and associated access mechanism than conventionally used with DRAM systems.

BACKGROUND OF INVENTION

In earlier days, the primary means for storing data in computer, microprocessor and similar systems, resided in a transistor-based high speed circuit that stored each bit of information—a so-called static random access memory device, termed SRAM, summarily described, for example, on page 295–300 of a catalog of Samsung Electronics entitled *MOS Memory,* 1993/94. A Samsung Type KM644002 cmos SRAM, for example, was presented in a 32-pin plastic unit (400 mil) providing 1,048,576 words by 4 bits and using four common input and output lines and an output enable pin operating faster than the address access time at read cycle—the fast access times ranging from 15 to 25 ns. In order uniquely to select one of the over 1 million locations, 20 address bits are rejoined (20 of the pins being address pins) along with 4 data pins and control signals.

In an effort to meet increased RAM requirements, the concept was evolved of storing each bit in a small capacitor on the silicon unit or die, the integration of a large number of capacitors taking far less space than transistors—so-called dynamic random access memory or DRAM units. The resulting advantages of the DRAM unit in increased storage capacity, higher data bandwidth and savings in terms of device size, board space, power consumption and cost, particularly when large numbers of such devices are implemented in a design, outweighed the necessity for periodic charging of capacitors, and more complex access mechanisms and control circuits; and DRAM became one of the most, if not the most, popular type of memory.

The external circuit interface of the DRAM, moreover, differs significantly from the SRAM. Contrasting the illustrative Samsung Type KM644002 SRAM above-described, with a corresponding Samsung Type KM44C1000B CMOS DRAM, as described on pages 330–337 of said Samsung catalog, the addressing is similar to uniquely identifying an element within a matrix, with each location in the address space being accessed by providing a row address and a column address. For the 1 million×4 bit example, only a total of 20 address bits are required, 10 bits used to select the row in which the bit is located and 10 bits selecting the column of the desired bit in the selected row. As compared with the SRAM device only 10 address pins are provided and 4 data bits along with few control lines, resulting in a package of just 20 pins, providing considerable savings in terms of board space, power consumption and cost. The DRAM access mechanism is as follows. A 10 bit row address followed by a 10 bit column address are provided on the same pins sequentially by the external circuit, with the internal circuit using this sequentially provided information to select the desired unique location as described in the said catalog. The external circuit interface of this DRAM is asynchronous in nature and thus it is also called an asynchronous or async DRAM.

This sequential occurrence of row and column addresses instead of presenting the entire address at the same time, however, delays the storage and retrieval of information compared to the SRAM, and as more particularly shown on said pages 336 and 337, for example, as compared with the SRAM read and write access cycles described on pages 299 and 300.

Over a period of time, however, system requirements expanded, dictating capacity, higher data bandwidth, faster access time, burst mode accesses, and synchronous operation as distinguished from async DRAM.

The art progressed with incremental improvements, successively providing higher density async DRAMs with faster access time and limited burst mode capability, such as page mode access. DRAMs with synchronous interface then also came into existence. Higher data bandwidth devices with larger pin count were also developed, but had limited market success due to their large package size. The higher data bandwidth requirement, moreover, had to be fulfilled by using either more components or wider data bandwidth components with larger pin counts, unfortunately but necessarily leading to more board space and power consumption and the disadvantages thereof.

Such development in this art leading incrementally to these enhanced devices providing higher density and faster speed, however, still stayed with the basic architecture, external circuit interface and access mechanism. Each new generation of DRAM had higher storage capacity and generally faster access time as they moved from 32K to 64K, 256K, 1M, 4M, 16M and 64M with 256M under development.

This async DRAM evolution was largely fueled by the availability of new generations of high speed microprocessors with large data bandwidth and addressing capabilities. These new processors offered data transfer modes where multiple memory accesses are made in a burst to speed up the storage and retrieval process. Since the async DRAMs, however, have limited burst mode capability, they created bottlenecks in the system perfomance as burst transfers became a significant portion of all the accesses to memories. The requirement to process the burst mode efficiently and development of new generation of CAD tools and design methodologies thus demanded synchronous designs and gave impetus to developing the before-mentioned synchronous or sync DRAM (SDRAM). A major departure was made when moving from async to sync DRAM.

A clock is provided in the SDRAM and all accesses are synchronous to the clock. It is optimized for burst transfer accesses and has substantially higher burst access speeds. After initial set up time, data is stored or retrieved every clock cycle for the whole burst. A typical 4M×4 SDRAM and its internal structure is the micron type MT48 described on pages 2-1 and 2-2 of the Micron Semiconductor data book of 1994. The access mechanism for read and write cycles of SDRAM devices is described, for example, on pages 4–525 and 4–526 of the Texas Instruments catalog entitled MOS Memory, 1993, with such SDRAM having different access mechanisms than async DRAM and requiring different external circuits to generate the control signals.

It should be noted, however, that mind-set of those skilled in this art required that both synchronous and async DRAMs should retain the notion of sequentially providing row and column accessed addresses, and with the data interface implemented separately from the address interface.

While major demands created by the growth, in the system arena were thus solved between async and SDRAMs, one problem has remained largely unsolved; namely, the growth in data bandwidth has deleteriously consumed large numbers of DRAMs occupying precious board space and demanding more power.

In the current state of the art, thus, a typical configuration employs multiple DRAMs to provide wider bandwidth and large memory arrays. This is better illustrated with an example.

Assuming a processor with a 64-bit wide data bus and system requirements of 4M×64 memory, the use of both SDRAM and async DRAMs, requires 16 DRAMs, assuming 4M×4 DRAM as a basic unit. If, on the other hand, 4M×16 DRAMs are used (much larger package size than 4M×4) then only 4 DRAMs are needed, but they still occupy substantially more space than four 4M×4 packages.

It is therefore obvious that in spite of major changes made while developing SDRAM, the number of components for similar configuration has stayed the same. This continues to put huge demand on the board space as the memory requirement grows. In fact, the SDRAMs have larger package sizes for comparable densities, with 16 DRAMs occupying more space than 16 async DRAMs.

Granularity is another problem or issue with the existing DRAMs. There is no easy way to get odd sizes (sizes which are not multiples of 4) such as 2M×64 or 6M×64, without using large numbers of components. As an example, if it is desired to get a 6M×64 memory configuration, then thirty two 4M×4 devices are required.

Pin-to-pin compatibility with successive generation, moreover, exists only for a very narrow range. The package size grows quickly along with the density of the DRAM; and this forces redesigns to keep up with ever-increasing system memory requirements, since higher density chips require bigger footprints.

In general, with higher numbers of components of smaller package size or smaller numbers of components with larger package size, the current state of the art of DRAM technology consistently demands increased board space higher power consumption, more manufacturing and assembly cost, lower MTBF, coarse granularity, and pin compatibility only for a very small range of DRAMs. These problems still persists in spite of two decades of work.

The startling discovery underlying the present invention, synergistically breaks through all these disadvantages and limitations enabling, for the same configuration, a reduced number of components; and, for comparable density, providing smaller package sizes with lower power consumption, lesser manufacturing and assembly costs, better MTBF, finer granularity, and greatly expanded pin compatibility for a wide range of DRAMs. The invention, indeed, provides increased capability in data bandwidth and addressing range over current DRAM devices (using the same pin count and size device) or equivalent bandwidth and addressing range with smaller DRAM devices packages, both async and SDRAM. This is accomplished with a total departure from the direction uniformly taken in this art over the past decades, employing, rather, a novel interface and associated access mechanisms and procedure.

OBJECTS OF INVENTION

An object of the present invention, accordingly, is to provide a new and improved method of and apparatus for improving the data bandwidth and addressing range of current and past dynamic random access memory devices; either increasing the data bandwidth and addressing range for current-size devices of this character and/or providing equivalent bandwidth and addressing range thereof in smaller devices, all in obviation of the disadvantages and limitations of the prior art as previously described.

A futher object is to provide a novel interface and associated addressing mechanism for dynamic random access memory devices.

Other and further objects will be explained hereinafter and are more fully delineated in the appended claims.

SUMMARY

In summary, however, from one of its viewpoints, the invention embraces a method of improving the data bandwidth and addressing range capabilities of a dynamic random access memory device of the type conventionally having row and column address, data input, data output, and enable pins, and operating with addressing, data write and read cycle control lines connected with corresponding of said pins, the method comprising, on each of write and read cycles, respectively initially addressing row address on a predetermined set of the pins; then addressing on each of the write and read cycles, column address along the row on the same predetermined set of pins; then, on each of said write and read cycles, and following their respective column addressing, applying and retreiving data on the same predetermined set of pins during the respective write and read cycles, thereby reducing the number of pins required for addressing, writing and reading, and thus increasing data bandwidth and addressing range capabilities of the device.

Preferred techniques and best mode designs are hereinafter presented in detail.

DRAWINGS

The invention will now be described in connection with the accompanying drawings, FIG. 1 of which is a plan view of an illustrative or exemplary 24-pin asynchronous 4M×4 baseline asynchronous DRAM and control lines and pins adapted for the practice of the invention;

Figure 2:
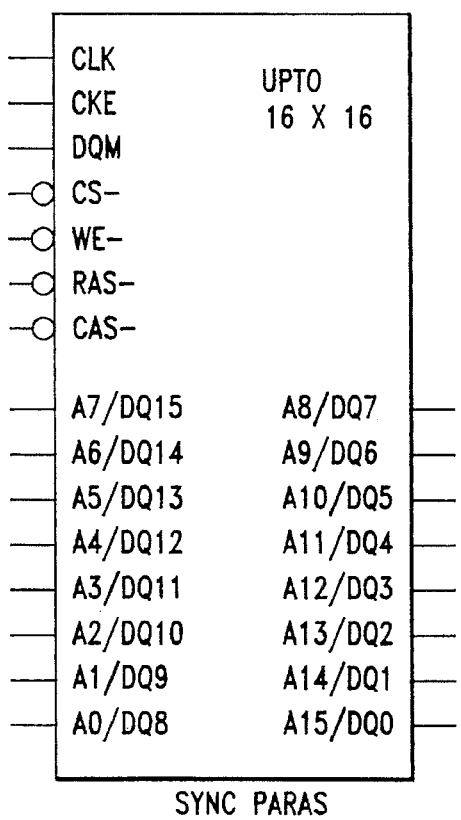
FIG. 2 is a similar view of a 44-pin synchronous SDRAM version.
Figure 3:
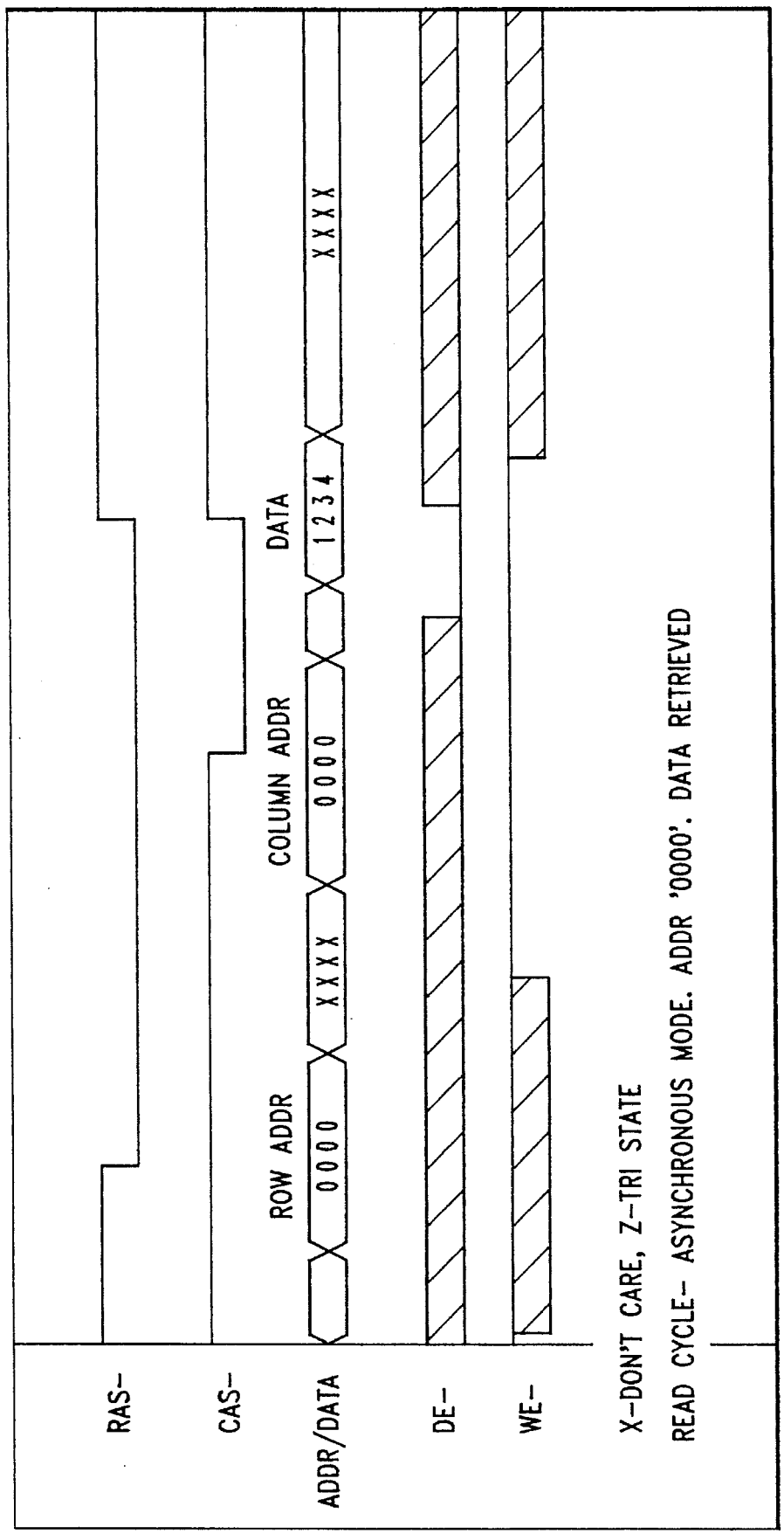
FIGS. 4 and 3 are control line signal and operational timing diagrams of the method and sequence of operating the device of FIG. 1 in accordance with the present invention, showing addressing and data accessing during the write and read cycles, respectively.
Figure 4:
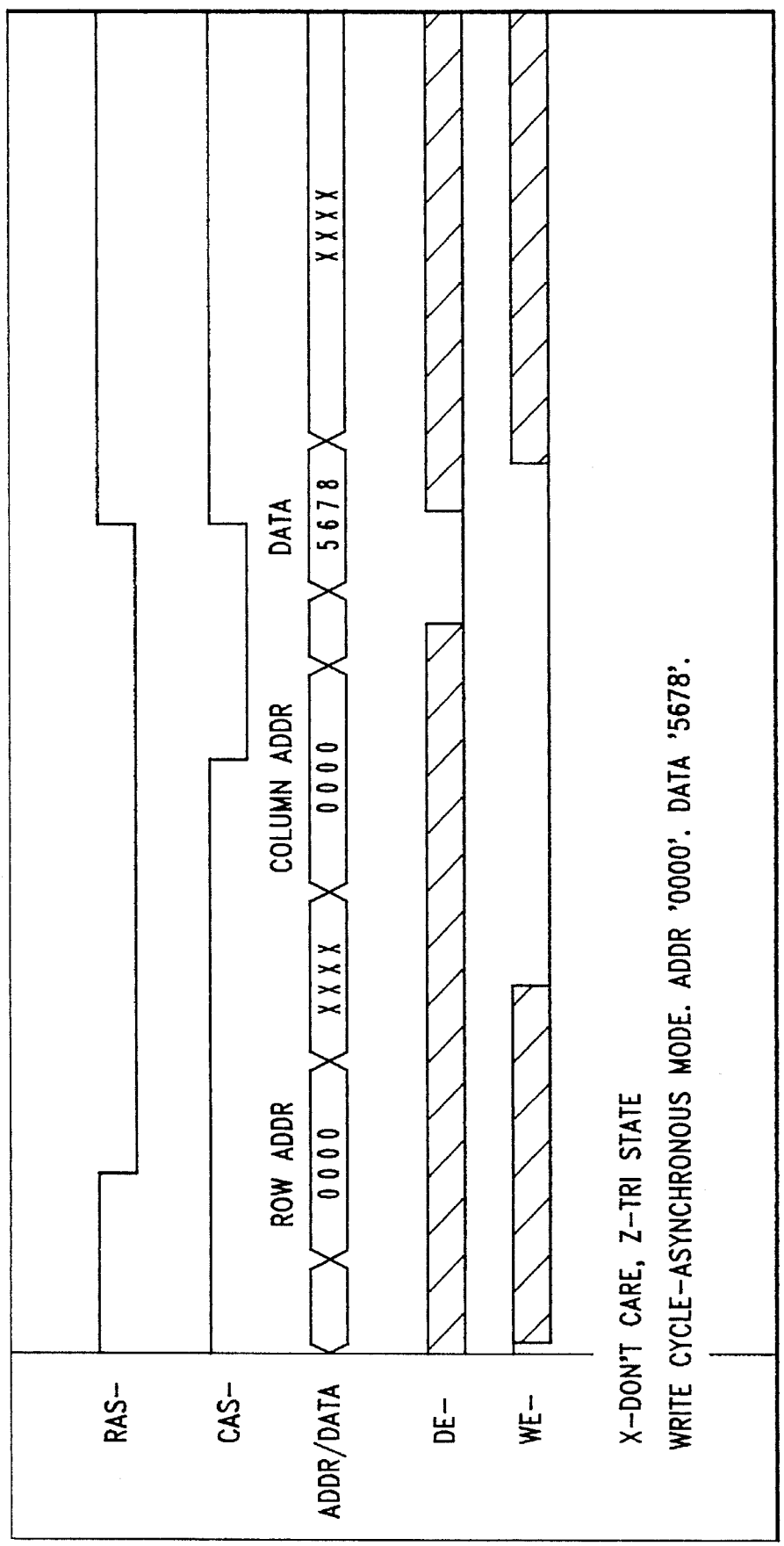
Figure 5:
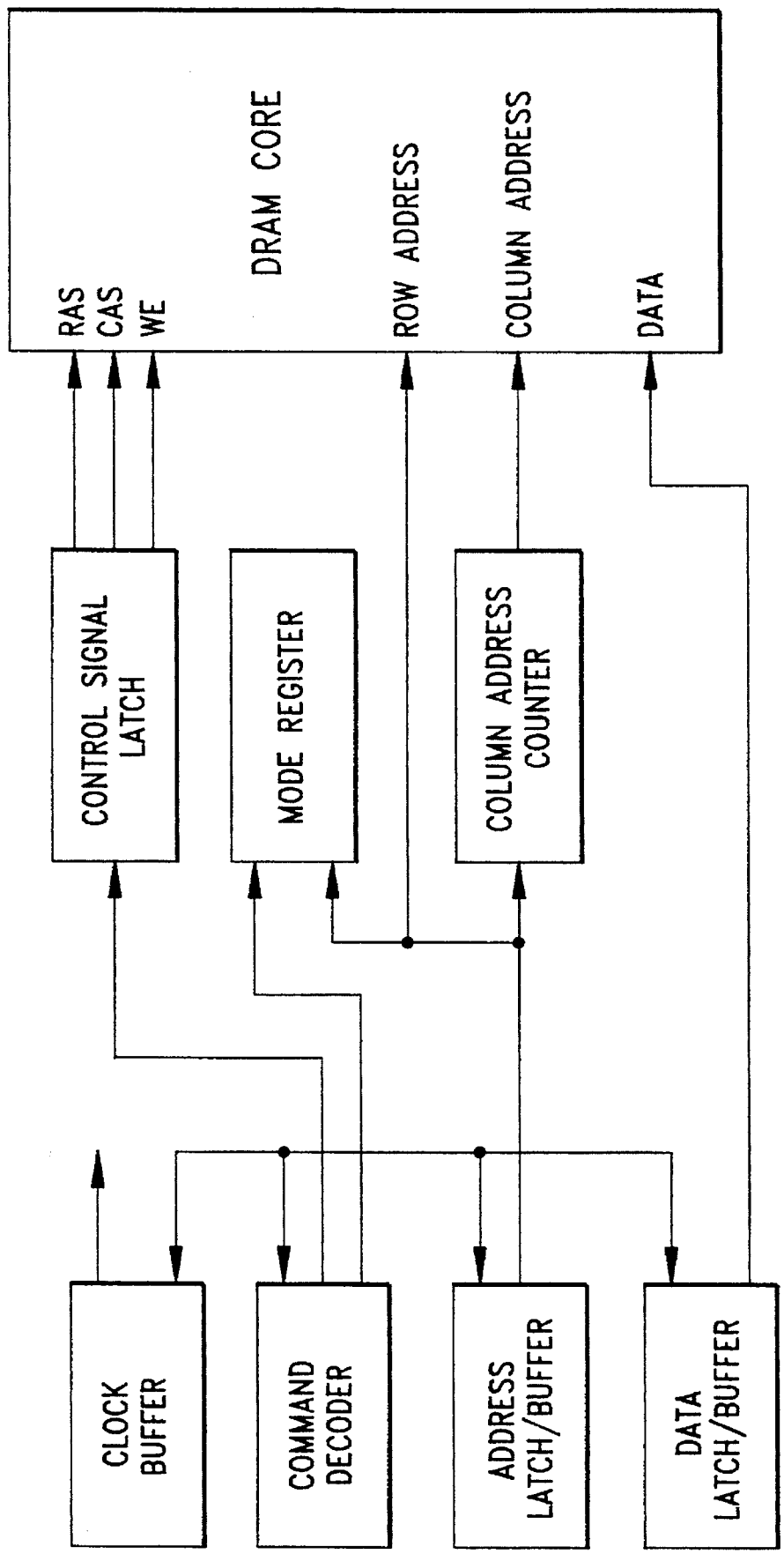
FIG. 5 is a block and circuit diagram of apparatus for operating the synchronous device of FIG. 2 in accordance with the technique and interfacing of the invention.
Figure 6:
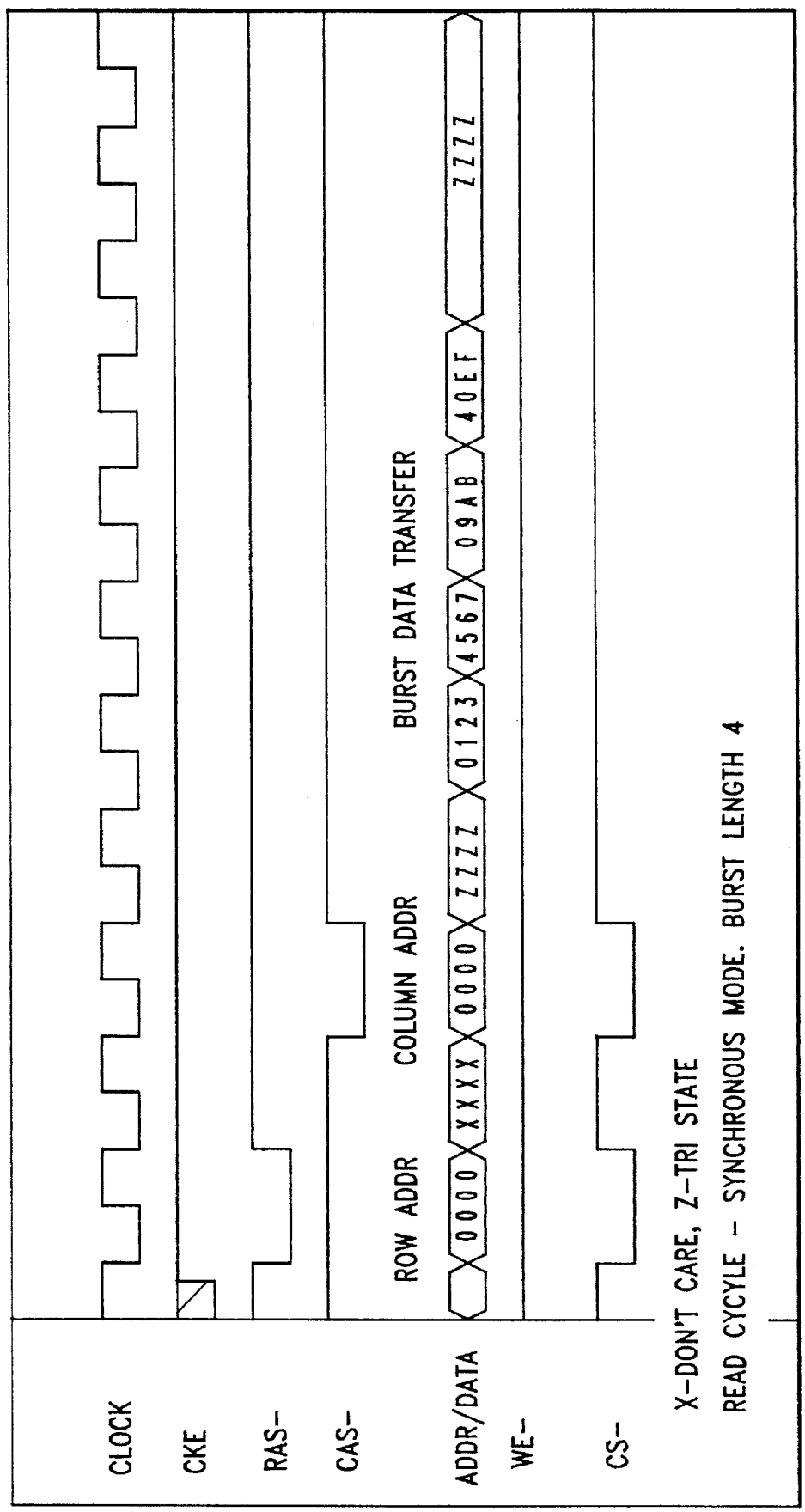
Figure 7:
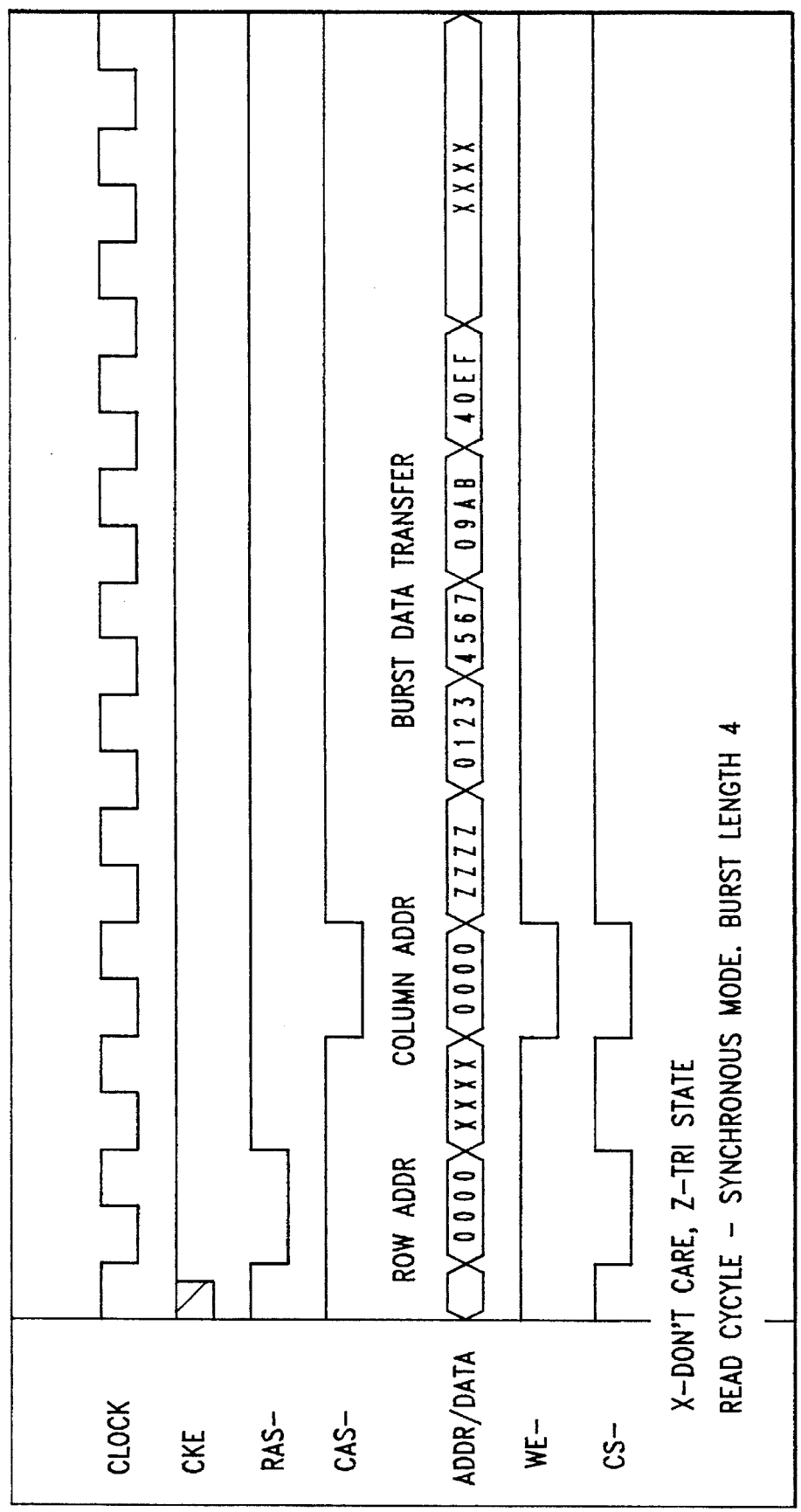
Figure 8:
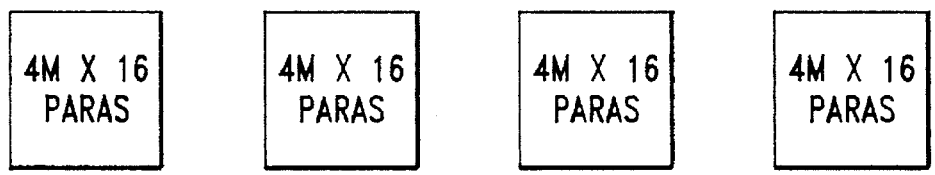
Figure 9:
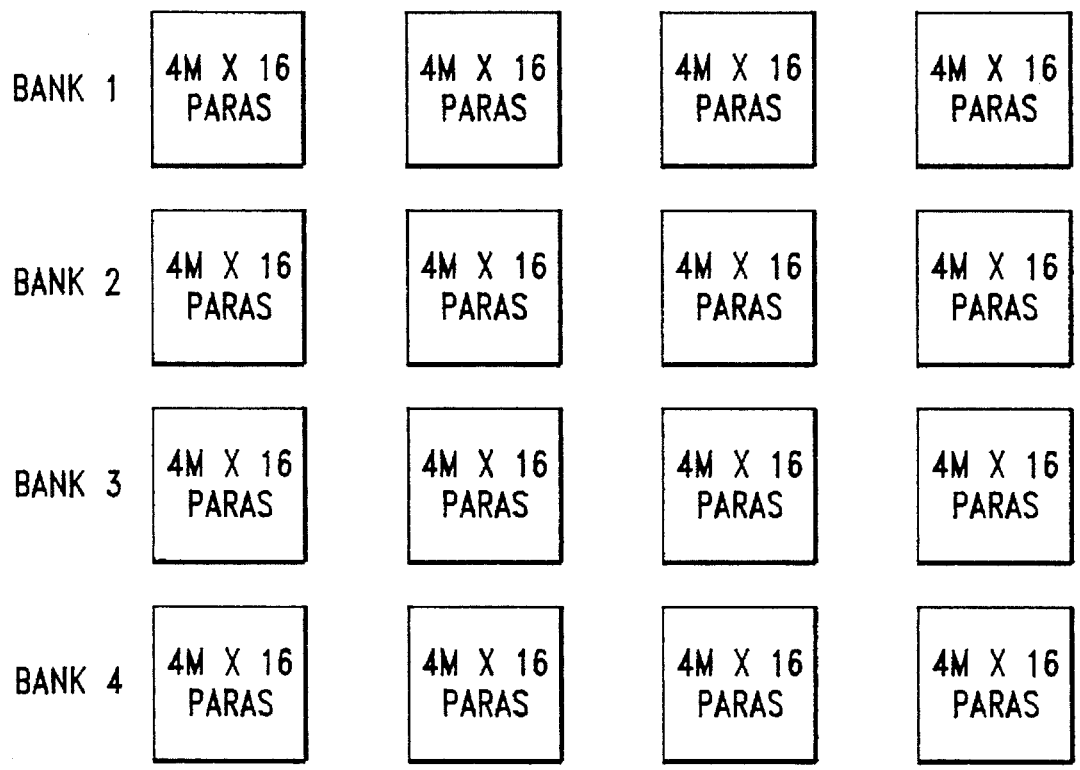

FIGS. 7 and 6 correspond, respectively, to the timing and operation diagrams of FIGS. 4 and 3, but are directed to the operation of the SDRAM device of FIGS. 5 and 2 in accordance with the invention;

FIGS. 8 and 9 are block diagrams respectively showing 4M×64 and 16M×64 configurations embodying dynamic random access memory devices of the invention; and FIG. 10 is a similar diagram contrasting the prior art with the system of FIG. 9.

DESCRIPTION OF PREFERRED EMBODIMENT(S)

As before stated, the invention (coined 'PARAS') has a distinct external circuit interface and a unique access mechanism which differ radically from the before-described existing techniques used by either the async DRAM or SDRAM.

In accordance with the invention, the row address is provided on a set of pins, followed by column address, and then data is transferred over the same pins. The data to be stored during the write cycle follows the column address, instead of, as in current existing access mechanism approaches being presented to the DRAM simultaneously. While this may have some adverse impact on the write timing for the single access and on the first write of the burst access this is deemed trivial as impaired with the extrordinary advantages of the invention. The data retrieval for read access, moreover, is not substantially affected.

This unique access mechanism of the invention can be beneficially used in two ways:

1. If it is desired to maintain compatibility with the existing standard package sizes of the DRAM, then the invention enables the data bandwidth and addressing capability within the similar package to be increased dramatically.

With the invention, the number of data bits increases as data is also tranferred over DRAMs. The addressing capability of the invention also enhances as the address is also provided over what are currently used as the data-only pins in the existing factor of four for every data pin offered in the existing DRAMs. For example, in the 'PARAS' system of the invention, the number of uniquely addressacle locations will quadruple for a single-bit current existing DRAM; will be 256 times more for a 4-bit wide current DRAM; 65536 times more for an 8-bit wide current existing DRAM; will be 256 times more for a 4-bit wide current DRAM; 65536 times more for an 8-bit wide existing DRAM, and so on. The equation is $2^{2n}$ times additional addressing capability for an 'n' bit wide conventional DRAM.

This tremendous gain in both address and data bandwidth is acheived, moreover, without increasing the number of pins of the current DRAM.

2. Another option is to reduce the DRAM pin count and still get similar data bandwidth and addressing capability currently provided by the existing DRAM devices, but with a reduced or smaller package size.

With the novel access mechanism of the invention, devices can thus be built with smaller package sizes. For example, a 256K×16 DRAM which is currently provided in a 40-pin package can be reduced down to 24 pins and still provide higher density. This reduction will have major impact on both the board space, power consumption and other problems outlined above.

The impact of this proposed access mechanism is further illustrated by using an existing 4M×4 DRAM as an example, but is, of course not limited to this size DRAM only.

In this example, twenty two address bits are required to decode 1 out of 4 Meg storage cell locations. These 22 pins are split as either 11 pins for both row and column address or 12 pins for row and 10 for column address in current state of the art DRAMs. With the invention, on the other hand, where data is sequenced over the same 12 pins used for row/column address, an additional 12 data bits become available along with 4 original data bits to the external circuit. This results in the total bandwidth of 16 data bits and without increasing the package pin count. Thus, only four 'PARAS" chips of the invention are required for a 64 bit wide data bus in this context—a decided advantage over the traditional approach where a 64 bit wide bus needs 16 chips of similar package size.

Figure 1:
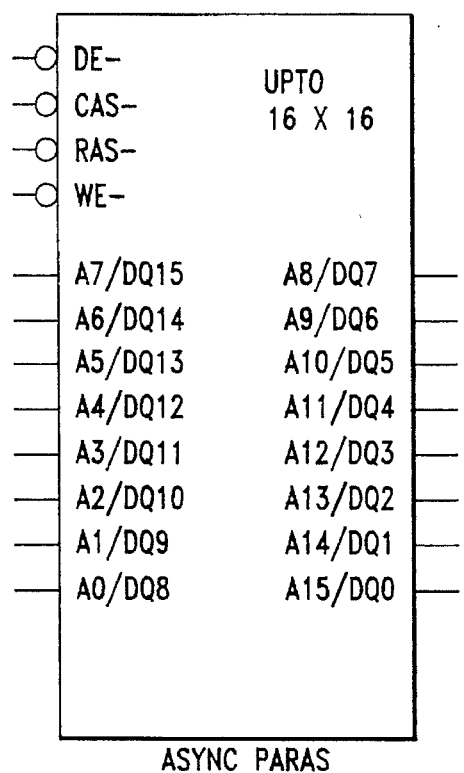

Continuing the example of a current 4M×4 DRAM, similar to that of the before referred Samsung catalog, 4 data bits DQ3, DQ2, DQ1 & DQ0 of such a traditional DRAM are also used for in FIGS. 1 and 2, DRAM illustrative async and SDRAM respectively, for row and column addresses during the address phase. This enables the availability of 4 additional address lines in the conversions of the invention, thus effectively resulting in 8 additional address lines. Using the multiplication factors described earlier, the number of addressable DRAM memory locations can, by the present invention, be increased by 256 times without increasing the package size. In fact, in this specific context, the address range will increase by 1024 times due to already assigned 12 address bits, when only 11 are needed.

It should now be pointed out that when implemented by the invention, a state of the art 24-pin package 4M×4 async DRAM is capable of accomodating up to 4G×16 bits (that is 64 Gigabytes)—an amazingly wide range. In fact development of 64 Gigabit DRAM had not even been expected in this century.

Similarly, when implemented as sync DRAM ('PARAS') a state of art 44-pin package 4M×4 SDRAM can also accomodate up to 4G×16 or 64 Gigabits.

These gains for the 4M×4 example represent better than 3 orders of magnitude improvement in storage capability in a comparable size package over current existing DRAMs.

In the top level symbolic presentations of async and sync versions of the invention in FIGS. 1 and 2 for the example described above, the pins and control lines are not listed for purposes of clarity, stressing just the novel features of the invention, and with conventional ground, power and byte select being omitted for better understanding only.

While in a wide range of instances comparability with current DRAMs is described it should be noted that; 'PARAS' is not guaranteed to be pin compatible with the existing devices always, but is expected to stay within the similar package sizes. This is specifically true for the sync version where some commands definition using address bits 'A10' & 'A11', FIG. 2, will have to be changed or defined differently to implement 'PARAS' access mechanism; though the overall package size remains the same or nearly the same.

As stated earlier, there is sometimes a possibilty that DRAM access might be slightly slower with the invention due to the shared usage of the same set of pins for different access phases, but the technique has overwhelming significant improvements. The exact impact on access time may indeed be negligible or none at all depending on the implementation. The read access is expected to be as fast and any delay will affect only the write cycles. Various implementations are possible for this architecture differing only in features and details, but with the same essential idea of the invention. The two major types of implementations, asynchronous mode and synchronous mode, will now be described in more detail.

Turning first to the asynchronous mode: the access for such implementation is shown in FIGS. 3 and 4 as correlated with the structure of FIG. 1. A row address is first provided using 'ras' (row address strobe), FIGS. 1, 3 and 4, as the control line. Next, the column address is presented over the same pins under the control of 'cas' signal.

In the case of the write cycle, "data" is driven or applied on the same pins after the "column address", as shown in FIG. 4. Hence the first write access will be slightly slower (since data appears after the column address on the same pins); but the subsequent accesses to the consecutive columns in the same row will be similar to the existing async DRAMs.

In the case of the read cycle, however, FIG. 3, "data" is retrieved over the same pins, and sequencing of "row address", "column address" and "data", respectively, will still have timings similar to the existing async DRAM. Since, in general with both the asynchronous mode and the later described synchronous, far more numbers of reads are performed in a typical system than writes, the before-suggested minor performance degradation during write cycles will not be significant. In addition, if cache is used in the system design, this slight degradation will further diminish to very low levels.

A syncronous ('PARAS') DRAM top level internal block diagram is shown in FIG. 5 for ease of explanation only. A clock and clock enable signal is provided in such type of DRAM and the access for such an implementation is shown in FIGS. 6 and 7 and in the context of the device of FIG. 2. Here, the traditional names such as 'ras', 'cas' etc. take additional meanings as they are also used to load control commands. The "row address" is loaded with a 'ras' pulse and an appropriate combination of other control signals. Next, the "column address" is loaded over the same pins with 'cas' being low and with appropriate state of other signals. There are other commands such as 'activation', 'deactivation', 'precharge' etc. It should be noted that in existing sync DRAM standards some commands can be issued during data phase which use 'A10' and 'A11' pins. In the adaption of the invention, these commands are redefined and executed differently, resulting in usage of two additional pins; but the overall package size may still be the same.

In the case of the write cycle, "data" is driven over the same pins after the "column address", as shown in FIG. 7. The first write access is expected to be one clock cycle slower than the traditional synchronous DRAMs, but the subsequent accesses in the same row will be every clock cycle. The exact delay for the first write access is subject to implementation and device technology.

With the read cycle, "data" is retrieved over the same pins after the "column address' is presented, as shown in FIG. 6 and sequencing of "row address", "column address" and "data", respectively, will have timings similar to existing sync DRAMs, as shown.

Continuing with an exemplary system level implementation using the 'PARAS' technique of the invention, and assuming the illustrative example of the 4M×64 memory array requirement only four 4m×16 'PARAS' type DRAMs (24 pin package, in the case of async 'PARAS' and 44 for sync 'PARAS') are needed, FIG. 8, to achieve the desired configuration, instead of sixteen current existing access mechanism based 4M×4 DRAMs, presuming comparable package size devices are used. This saves considerable board space, reduces power consumption, provides better MTBF and a drop in compatibility with higher density DRAMs for future expansion.

As greater system memory requirements are required in the future, from 4M×64 to 64M×64, the 64M×16 'PARAS' DRAMs can be dropped in place of 4M×16, as they will be pin compatible. This contrasts with prevailing technology where a new board design and subsequent significant manufacturing related expenses must be incurred. Time to market is a major factor and will be seriously affected, since 4M×4 existing DRAMs are not pin compatible with future 64M×4. As stated earlier, moreover, the invention is capable of accomodating storage sizes 256 times larger for x 4 configuration of existing DRAMs and 65536 times for x 8 configuration of existing DRAMs with the comparable package size.

And though there are presently existing devices of wider data bandwidth, they also have much larger package sizes as contrasted further with the invention.

As frequently pointed out, the invention also provides much finer granularity than the existing sync or async DRAMs and consumes far lower numbers of components when multiple banks are used in the design. If, as an example, 4 separate banks of 4m×64 are needed, FIG. 9, the based array of the invention would need only 16 devices, as shown. This compares well against the existing async or aync DRAM-based implementation, which will consume 64 components, as shown in FIG. 10.

A column address counter, furthermore, is preferably incorporated in the invention to facilitate sequential access fast page mode and with faster access than the traditional async design; the invention, in all cases, providing increased address and data bandwidth and, where desired, resulting in substantially lower numbers of components. The system and technique of the invention are thus expected to be immensely useful for large numbers of applications and serving as a critical component for designs where space and power consumption are at a premium.

In the external circuit interface, the memory controller has different sequencing and timings, as before explained, than what traditional DRAM designers employ, with the multiplexer circuit used to multiplex the row and column address being of tristate type, FIG. 3, 4, 6 and 7, to allow for the data to reside on the same bus.

In conclusory summary, with the use of the invention, the package size is kept comparable with current devices, but the number of data bits has increased significantly. The increased data bandwidth at each part results in significantly reduced number of parts required to meet the wider data bus size, and the package size is kept the same or nearly the same, but with the number of uniquely addressable locations increased significantly.

A most significant advantage of 'PARAS' resides in the larger data bandwidth and higher potential density which have a significant impact on the system implementation, enabling reduced board "real estate", lower power consumption, reduced manufacturing cost, and a large range of drop-in pin compatibility.

Further modifications will occur to those skilled in this art, and such are considered to fall within the spirit and scope of the invention as defined in the appended claims.

What is claimed is:

1. A method of improving the data bandwidth and addressing range capabilities of a dynamic random access memory device of the type conventionally having row and column address, data input, data output, and enable pins, and operating with addressing, data write and read cycle control lines connected with corresponding of said pins, the method comprising, on each of write and read cycles, respectively initially addressing row address on a predetermined set of the pins; then addressing on each of the write and read cycles, column address along the row on the same predetermined set of pins; then, on each of said write and read cycles, and following their respective column addressing, applying and retrieving data on the same predetermined set of pins during the respective write and read cycles, thereby reducing the number of pins required for addressing, writing and reading, and thus increasing data bandwidth and addressing range capabilities of the device.

2. A method as claimed in claim 1 and in which substantially the same device pin count is maintained as in a conventional DRAM, but with the reduced number of required predetermined set pins enabling additional data handling capability with the remaining pins of the DRAM, thereby providing increased data bandwidth and addressing range capability for substantially the same size device.

3. A method as claimed in claim 2 and in which the increased addressing capability provides a multiple of four times each data pin provided in the DRAM device.

4. A method of improving the data bandwidth and addressing range capabilities of a dynamic random access memory device of the type conventionally having row and column address, data input, data output, and enable pins, and operating with addressing, data write and read cycle control lines connected with corresponding of said pins, the method comprising, on each of write and read cycles, respectively initially addressing row address on a predetermined set of the pins; then addressing on each of the write and read cycles, column address along the row on the same predetermined set of pins: then, on each of said write and read cycles, and following their respective column addressing, applying and retrieving data on the same predetermined set of pins during the respective write and read cycles, thereby reducing the number of pins required for addressing, writing and reading, and thus increasing data bandwidth and addressing range capabilities of the device, and in which substantially the same device pin count is maintained as in a conventional DRAM, but with the reduced number of required predetermined set pins enabling additional data handling capability with the remaining pins of the DRAM, thereby providing increased data bandwidth and addressing range capability for substantially the same size device, in which the increased addressing capability provides a multiple of four times each data pin provided in the DRAM device, and in which the increased addressing capability quadruples for a single-bit DRAM, is 256 times more for a 4-bit wide DRAM, and is 65536 times more for an 8-bit wide DRAM.

5. A method as claimed in claim 4 and in which the said device is one of a substantially 24-pin DRAM and 44-pin SDRAM, 4M×4, and said increased capability is extended to 64 Gigabits.

6. A method as claimed in claim 1 and in which the reduced number of required predetermined set pins enables the use of a smaller device than conventionally used dynamic random access memory device types of equivalent data bandwidth and addressability.

7. A method as claimed in claim 1 and in which the dynamic random access memory device is of the asynchronous DRAM type, wherein the first write cycle access, since occurring after the column address on said same predetermined pins, is slightly slower than if separate row, column and data pins are employed as in a conventional asynchronous DRAM device, but not for the subsequent write cycle accesses to the consecutive columns in the same row.

8. A method as claimed in claim 7 and in which, in the read cycle, the timings of the row address, column address and data sequencing correspond to those of said conventional asynchronous DRAM.

9. A method as claimed in claim 1 and in which the dynamic random access memory device is of the synchronous SDRAM type, wherein the write and read cycle accessing is controlled by a clock; the first write cycle access, since occurring after the column address, is slightly slower than if separate row, column and data pins are employed as in conventional SDRAM devices, but not for the subsequent write cycle accesses to the consecutive columns in the same row; and the timing of the row address, column address and data sequencing correspond to that of said conventional SDRAM.

10. A dynamic random access memory apparatus having, in combination, a DRAM device provided with row and column address, data input, data output, and enable pins and addressing, data write and read cycle control lines for connection with said pins; means for connecting ras control lines for row address addressing to a predetermined set of said pins during each of the write and read cycles to address the row during the respective cycles on said predetermined set of pins; means for then connecting cas control lines for column address addressing to the same predetermined set of pins and during the respective write and read cycles, to sequence the successive columns of the row during the respective cycles; means operable during each of the respective write and read cycles, but following the respective column addressing thereof, for thereupon respectively applying and retrieving data to and from the same predetermined set of pins during the respective write and read cycles.

11. Apparatus as claimed in claim 10 and in which the DRAM device is contained in a package of similar size and number of pins, greater than said predetermined set of pins, as a conventional DRAM operated by sequentially providing row and column addressing, while implementing data interfacing separately from and on different pins than address interfacing; whereby the pins in excess of said predetermined set of pins are useable for providing increased accessing capability including increased data bandwidth and addressing range over said conventional DRAM.

12. Apparatus as claimed in claim 10 and in which the predetermined set of pins is of number less than required by a conventional DRAM operated by sequentially providing row and column addressing, while implementing data interfacing separately from and on different pins than address interfacing; whereby a smaller package for attaining equivalent data bandwidth and addressing range to that of said conventional DRAM is achieved.

13. Apparatus as claimed in claim 10 and in which the DRAM device is one of an asynchronous and a synchronous device.

14. Apparatus as claimed in claim 13 and in which the synchronous device is provided with a clock means for controlling the write and read cycle accessing.

15. A dynamic random access memory apparatus having, in combination, a DRAM device provided with row and column address, data input, data output, and enable pins and addressing, data write and read cycle control lines for connection with said pins; means for connecting cas control lines for row address addressing to a predetermined set of said pins during each of the write and read cycles to address the row during the respective cycles on said predetermined set of pins; means for then connecting cas control lines for column address addressing to the same predetermined set of pins and during the respective write and read cycles, to sequence the successive columns of the row during the respective cycles; means operable during each of the respective write and read cycles, but following the respective column addressing thereof, for thereupon respectively applying and retrieving data to and from the same predetermined set of pins during the respective write and read cycles, and in which the DRAM device is contained in a package of similar size and number of pins, greater than said predetermined set of pins, as a conventional DRAM operated by sequentially providing row and column addressing, while implementing data interfacing separately from and on different pins than address interfacing; whereby the pins in excess of said predetermined set of pins are useable for providing increased accessing capability including increased data bandwidth and addressing range over said conventional DRAM, and in which means is provided for enabling said increased accessing capability to quadruple for a single bit DRAM, to attain 256 times more for a 4-bit wide and to attain 65536 times more for an 8-bit wide DRAM.

16. A method of improving the data bandwidth and addressing range capabilities of a dynamic random access memory device of the type conventionally having row and column address, data input, data output, and enable pins, and operating with addressing, data write and read cycle control lines connected with corresponding of said pins, the method comprising, on each of write and read cycles, respectively addressing row address and column address along the row on the same predetermined set of pins; then, on each of said write and read cycles, and following their respective addressing, applying and retrieving data on the same predetermined set of pins during the respective write and read cycles, thereby reducing the number of pins required for addressing, writing and reading, and thus increasing data bandwidth and addressing range capabilities of the device.

17. A dynamic random access memory apparatus having, in combination, a DRAM device provided with row and column address, data input, data output, and enable pins and addressing, data write and read cycle control lines for connection with said pins; means for connecting ras control lines for row address addressing and cas control lines for column address addressing to the same predetermined set of pins and during the respective write and read cycles, to sequence the successive rows and columns during the respective cycles; means operable during each of the respective write and read cycles, but following the respective addressing thereof, for thereupon respectively applying and retrieving data to and from the same predetermined set of pins during the respective write and read cycles.

* * * * *